United States Patent
Nazarian et al.

[11] Patent Number: 5,821,794
[45] Date of Patent: Oct. 13, 1998

[54] CLOCK DISTRIBUTION ARCHITECTURE AND METHOD FOR HIGH SPEED CPLDS

[75] Inventors: Hagop Nazarian, San Jose; Donald A. Krall, Cupertino; S. Babar Raza, Sunnyvale, all of Calif.

[73] Assignee: Cypress Semiconductor Corp., San Jose, Calif.

[21] Appl. No.: 626,043

[22] Filed: Apr. 1, 1996

[51] Int. Cl.⁶ ..................................................... H03K 1/04
[52] U.S. Cl. .......................... 327/298; 327/29; 327/296; 327/407
[58] Field of Search .................................... 327/129, 152, 327/293, 295, 296, 298, 407; 370/537

[56] References Cited

U.S. PATENT DOCUMENTS

| | | | |
|---|---|---|---|
| 4,229,699 | 10/1980 | Frissell | 327/407 |
| 4,419,629 | 12/1983 | O'Brien | 327/298 |
| 4,918,641 | 4/1990 | Jigour et al. | 364/716 |
| 4,999,526 | 3/1991 | Dudley | 327/152 |
| 5,510,742 | 4/1996 | Lemaire | 327/407 |
| 5,589,782 | 12/1996 | Sharpe-Geisler | 326/38 |
| 5,652,536 | 7/1997 | Nookala et al. | 327/407 |

Primary Examiner—Timothy P. Callahan
Assistant Examiner—Jung Ho Kim
Attorney, Agent, or Firm—Maiorana & Acosta, PC

[57] ABSTRACT

The present invention provides a clocking circuit allowing individual macrocells in a particular macrocell block of a CPLD to use different polarities of the same clock. The input clock pin can now drive all the macrocells directly, which can eliminate additional buffering states and improve the clock to out timing, Tco, by (for example) 300 ps. The clocks are presented directly to the clock selection multiplexers for each macrocell. Additional functioning may be realized by implementing additional configuration bits inside the clocking architecture.

15 Claims, 5 Drawing Sheets

CLOCK DISTRIBUTION ARCHITECTURE AND METHOD FOR HIGH SPEED CPLDS

FIELD OF THE INVENTION

The present invention relates to CPLDs generally and, more particularly, to a circuit and method for clock distribution in high speed CPLDs.

BACKGROUND OF THE INVENTION

A complex programmable logic device (CPLD) has a number of macrocell blocks each containing a number of macrocells. Each macrocell typically has a clock selection multiplexer that allows a particular macrocell to be clocked with any one of a number of input clocks available. Each macrocell can use any one of the input clocks available independently of the other macrocells in the array. Additionally, each macrocell block typically employs a number of polarity multiplexers. The number of polarity multiplexers for each macrocell block corresponds to the number of clock inputs available on the chip. The polarity multiplexers determine the polarity of a particular clock input for all of the macrocells inside a particular macrocell block.

FIG. 1 illustrates a clocking scheme 10 of a typical CPLD. The clocking scheme 10 has a clock input section 12, a polarity configuration section 14 and a macrocell block section 16. The clock input section 12 produces a number of clocks 0~i that are presented to the polarity configuration section 14. The polarity configuration section 14 selects the appropriate clock polarity for all clocks in each macrocell block. The macrocell block section 16 has individual clock selection multiplexers per macrocell. The polarity configuration section 14 has a number of clock polarity multiplexers 18. The cell section 16 has a number of macrocell blocks 20. Each of the macrocell blocks 20 has a number of clock selection multiplexers 22a–22n and a number of macrocells 24a–24n. The number of macrocells 24a–24n are implemented according to the design criteria of a particular application. With the implementation illustrated in FIG. 1, individual macrocells 24a–24n in a particular macrocell block 20 cannot use different polarities of the same clock. If a clock is unused inside a macrocell block, the clock polarity multiplexer 18 for that clock unnecessarily burns dynamic current Icc.

FIG. 2 illustrates a more detailed diagram of the clocking scheme 10 illustrated in FIG. 1. The clock polarity multiplexers 18a, 18b and 18c each have an enabled inverter 26, an enabled inverter 28 and an inverter 30. The clock input section 12 contains an inverter 32, an inverter 34, an inverter 36, an inverter 38 and a CMOS pass gate 40. A set of buffers 42a, 42b and 42c are shown connected between the clock polarity multiplexers 18 and the clock selection multiplexers 22. Only one specific instance of a particular cell, for instance the clock input section 12 or the clock selection multiplexer 22, is shown in detail for the simplification of FIG. 2.

SUMMARY OF THE INVENTION

The present invention provides a clocking circuit allowing individual macrocells in a particular macrocell block of a CPLD to use different polarities of the same clock. The input clock pin can now drive all the macrocells directly, which can eliminate additional buffering states and improve the clock to out timing, Tco, by (for example) 300 ps. The clocks are presented directly to the clock selection multiplexers for each macrocell. Additional functioning may be realized by implementing additional configuration bits inside the clocking architecture.

The objects, features and advantages of the present invention include allowing individual macrocells in the same macrocell block to use different polarities of the same clock input, and offering the capability of (i) eliminating unnecessary buffering stages, (ii) improving the Tco, (iii) reducing the dynamic current Icc that is used if a particular clock is unused inside a macrocell block, etc.

BRIEF DESCRIPTION OF THE DRAWINGS

These and other objects, features and advantages of the present invention will be apparent from the following detailed description and the appended drawings and claims in which:

DETAILED DESCRIPTION OF THE PREFERRED EMBODIMENTS

Figure 3:
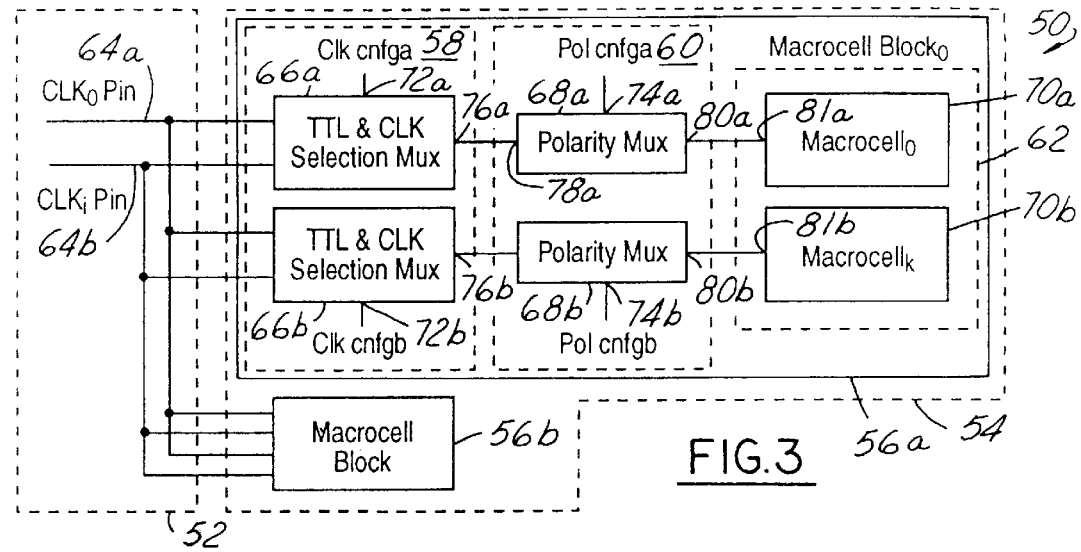
FIG. 3 is a block diagram of a preferred embodiment of the present invention.

Referring to FIG. 3, a block diagram of a clocking scheme 50 is shown in accordance with a preferred embodiment of the present invention. The clocking scheme 50 generally comprises a clock input section 52 and a macrocell section 54. The macrocell section 54 represents a macrocell register comprising a number of individual macrocell blocks 56a and 56b. The number of macrocell blocks 56a and 56b can be any number required for the design criteria of a particular application. Two macrocell blocks 56a and 56b are shown for illustrative purposes only. Each of the macrocell blocks 56a and 56b comprises a clock configuration multiplexer 58, a polarity multiplexer 60 and a macrocell section 62.

The clock input section 52 comprises a number of individual clock inputs 64a and 64b. The number of individual clock inputs 64a and 64b can be any number required for the design criteria of a particular application. Two clock inputs 64a and 64b are shown in FIG. 3 for illustrative purposes only. Each of the clock inputs 64a and 64b is presented to each of the clock selection multiplexers 58. Each of the clock configuration multiplexers 58 comprises a number of individual multiplexers 66a and 66b that correspond to a number of individual macrocells 70a and 70b in a particular macrocell block 56a or 56b. Similarly, the polarity multiplexer 60 comprises a number of individual polarity multiplexers 68a and 68b that also correspond to the number of individual macrocells 70a and 70b in a particular macrocell section 62. The macrocell section 62 comprises a number of individual macrocells 70a and 70b. Two macrocells 70a and 70b are shown for illustrative purposes only. It should be appreciated that any number (i.e., 1 to n) of macrocells 70a and 70b may be implemented in a typical design application.

Each of the configuration multiplexers 66a and 66b have a configuration input 72a and a configuration input 72b, that each receive a clock configuration signal clkcnfga or clkcnfgb. Each of the polarity multiplexers 68a and 68b has an input 74a and 74b that receives a polarity configuration signal polcnfga or polcnfgb. Both clock inputs 64a and 64b are presented to both configuration multiplexers 66a and 66b. The configuration multiplexer 66a, for example, selects between the clock inputs 64a and 64b according to the input 72a, and presents an output 76a to the polarity multiplexer 68a. The configuration multiplexer 66a presents only one of the clock inputs 64a or 64b at the output 76a according to the input 72a. The polarity multiplexer 68a receives the output 76a at an input 78a. The polarity multiplexer 68a presents an output 80a that is either a duplicate of the input 78a or a polarity inversion of the input 78a. The polarity multiplexer 68a presents the output 80a in response to the polarity configuration signal polcnfga received at the input 74a. The output 80a is a macrocell clock input 81a that is presented to the macrocell 70a. The macrocell 70a can receive either the clock input 64a or the clock input 64b (in either an exact form or an inverted form) as the macrocell clock input 81a. The macrocell 70b receives either the clock input 64a or the clock input 64b (in either an exact form or an inverted form) as an independent macrocell clock input 81b. The macrocell 70a and the macrocell 70b do not necessarily have the same clock input 64a or 64b or the same polarity as the macrocell clock inputs 81a or 81b. Each of the macrocells 70a and 70b can receive completely independent macrocell clock inputs. This is accomplished through independent polarity multiplexers 74a and 74b for each of the independent macrocells 70a and 70b. The macrocell block 56b includes all of the details described in connection with the macrocell block 56a. The details of macrocell block 56b are not shown for clarity of the figure. The number of macrocell blocks 56a and 56b may be implemented as any number (i.e., 1 to n) to produce the desired number of macrocells 70 required for a particular application.

Figure 4:
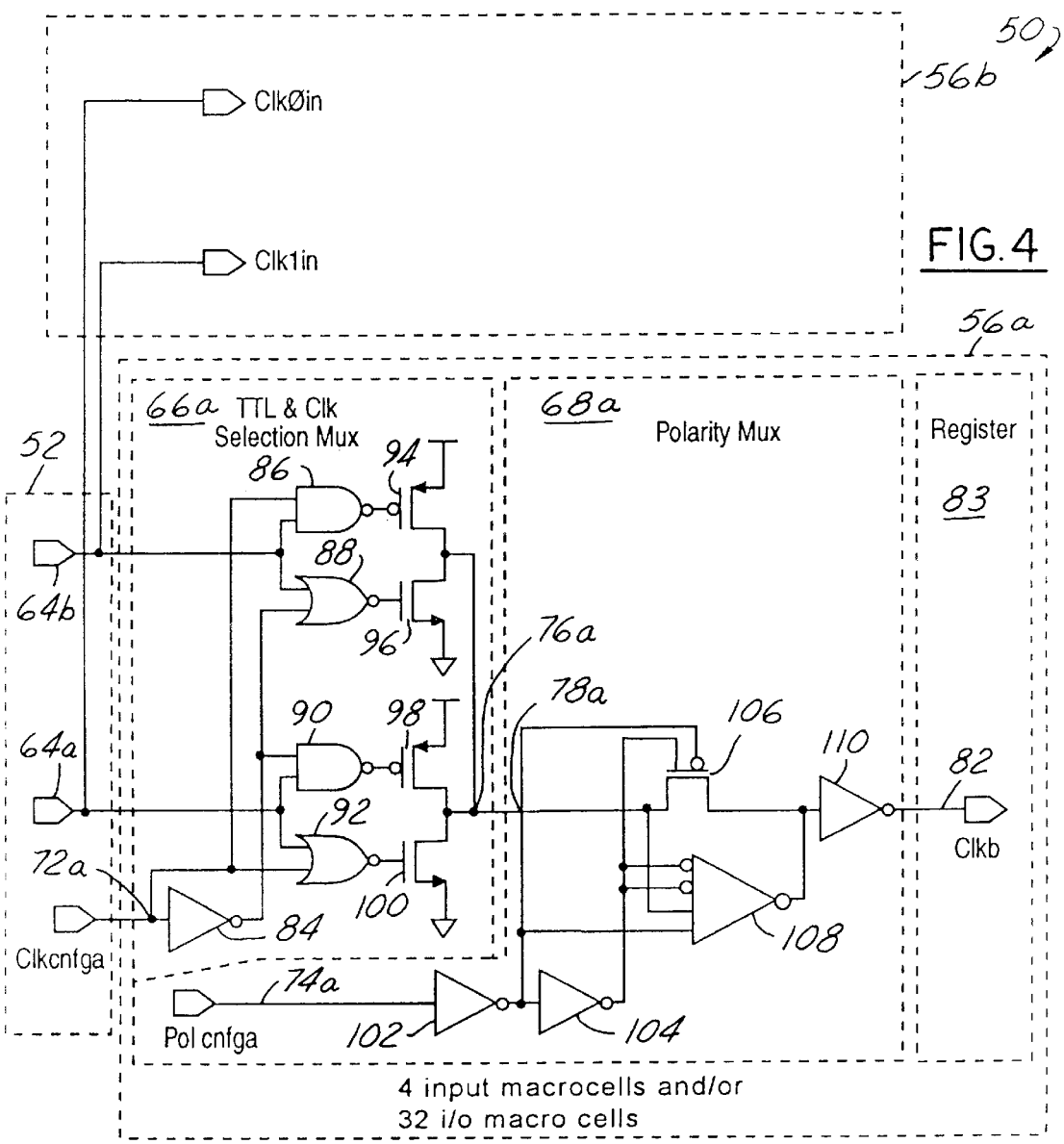
FIG. 4 is a more detailed block diagram of an embodiment of the present invention.

FIG. 4 illustrates a more detailed diagram of one embodiment the clocking scheme 50. The clock input section 52, the macrocell block 56a and the macrocell block 56b are each illustrated in more detail. The macrocell block 56b is an abbreviated representation without showing the internal components. Macrocell block 56a is shown in a more detailed diagram illustrating the various internal components including a configuration multiplexer 66a, a polarity multiplexer 68a and a register 83. The configuration multiplexer 66a comprises the clock configuration signal clkcnfga at an input 72a, an inverter 84, a NAND gate 86, a NOR gate 88, a NAND gate 90, a NOR gate 92, a transistor 94, a transistor 96, a transistor 98 and a transistor 100. The input 72a is presented to both the NAND gate 86 and the NOR gate 92. The input 72a is also presented, through the inverter 84, to both the NOR gate 88 and the NAND gate 90. The clock input 64b is presented to both the NAND gate 86 and the NOR gate 88. Similarly, the clock input 64a is presented to both the NAND gate 90 and the NOR gate 92. The output of the NAND gate 86 is presented to an inverted gate of the transistor 94. The output of the NOR gate 88 is presented to the gate of the transistor 96. The source of the transistor 94 is connected to the power supply (Vcc), while the drain of the transistor 94 is coupled to the drain of the transistor 96. The source of the transistor 96 is coupled to ground. The drain of the transistor 94 and the drain of the transistor 96 provide a portion of the output 76a that is presented to the polarity multiplexer 68a. The transistors 98 and 100 are configured in a similar fashion to the transistors 94 and 96. The drain of the transistor 98 and the drain of the transistor 100 are coupled together and provide another portion of the output 76a that is presented to the polarity multiplexer 68a.

The polarity multiplexer 68a comprises the input 74a, an inverter 102, an inverter 104, a CMOS pass gate 106, an enabled inverter 108 and an inverter 110. The input 74a is presented to the inverter 102. The inverter 102 presents an input to the inverter 104, a p-gate input of the CMOS pass gate 106 and a n-input of the enabled inverter 108. The inverter 104 presents an input to a n-gate input of the CMOS pass gate 106 and a p-enabled input of the enabled inverter 108. The input 78a, received from the configuration multiplexer 66a, is presented to a source input of the CMOS pass gate 106, a p-enabled input and an n-enabled input of the enabled inverter 108. The CMOS pass gate 106 has a drain that is connected to the inverter 110 which presents the macrocell clock input 82. The output of the enabled inverter 108 is also coupled to the inverter 110. The register 83 is a holding device for the macrocell clock input 82.

The discrete logic components described in connection with the configuration multiplexer 66a and the polarity multiplexer 68a illustrate one example of a receiving device implemented as a multiplexer. Any other implementation of a multiplexer, or a multiplexer functioning device, may be implemented without departing from the spirit and scope of the present invention. Additionally, the macrocell block 56b includes the circuitry described in connection with the configuration multiplexer 66a and the polarity multiplexer 68a. The macrocell block 56b is shown in an abbreviated fashion for clarity of the figure, but should be understood to include all of the internal components of the macrocell block 56a.

In order to take full advantage of the added flexibility of the clocking scheme 50, more configuration bits are required. For example, in a particular macrocell arrangement, there are often two clocks and n macrocells per macrocell block. Using a conventional clocking scheme 10, there would only be two polarity configuration bits required per macrocell block. However, to take full advantage of the flexibility of the present invention clocking scheme 50, n polarity configuration bits per macrocell block would be required where there are n macrocells per macrocell block.

Figure 1:
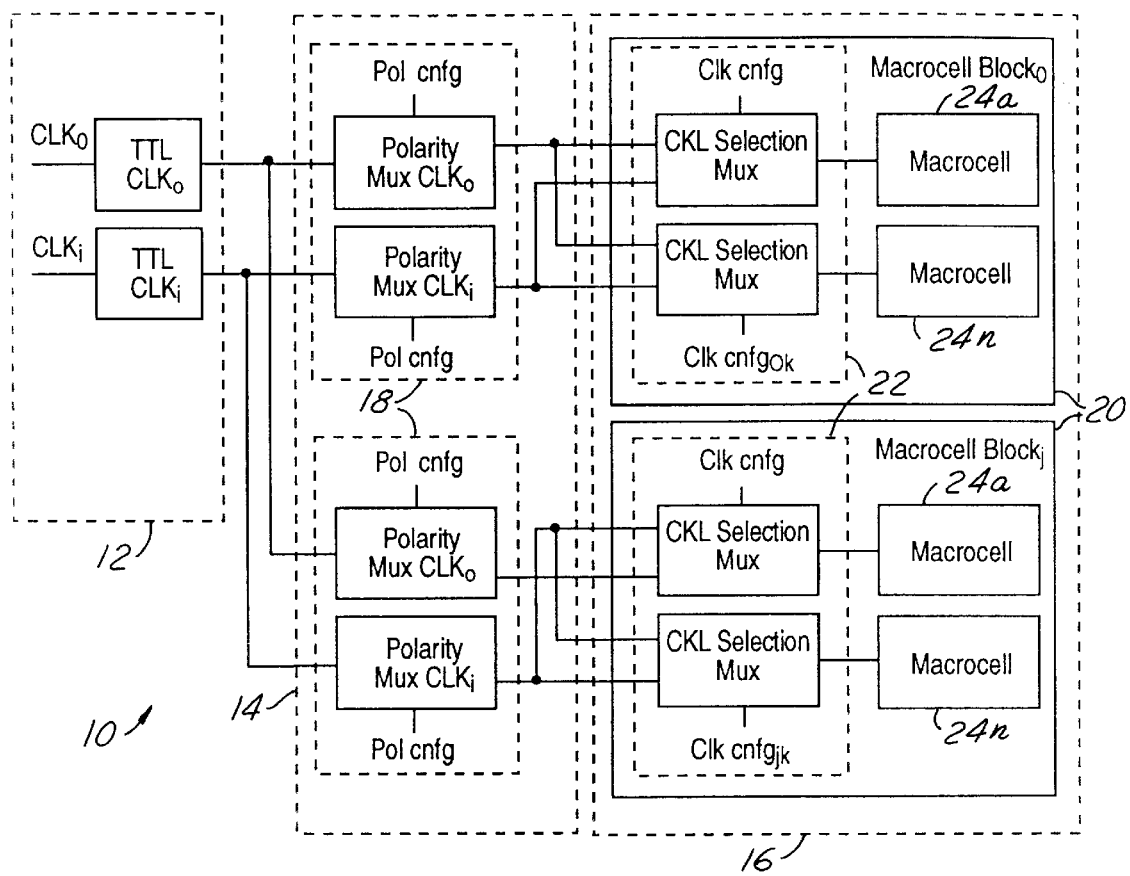
FIG. 1 is a block diagram of a clocking scheme used in CPLDs.
Figure 5:
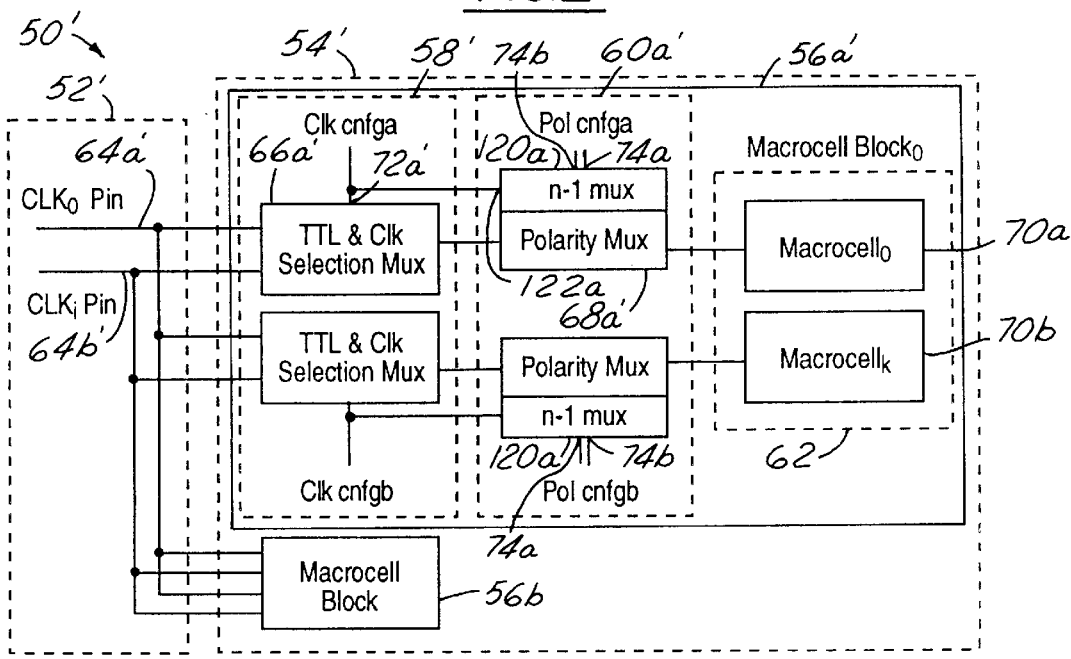
FIG. 5 is an alternate embodiment of the present invention that can be used to maintain consistency with conventional systems.
Figure 2:
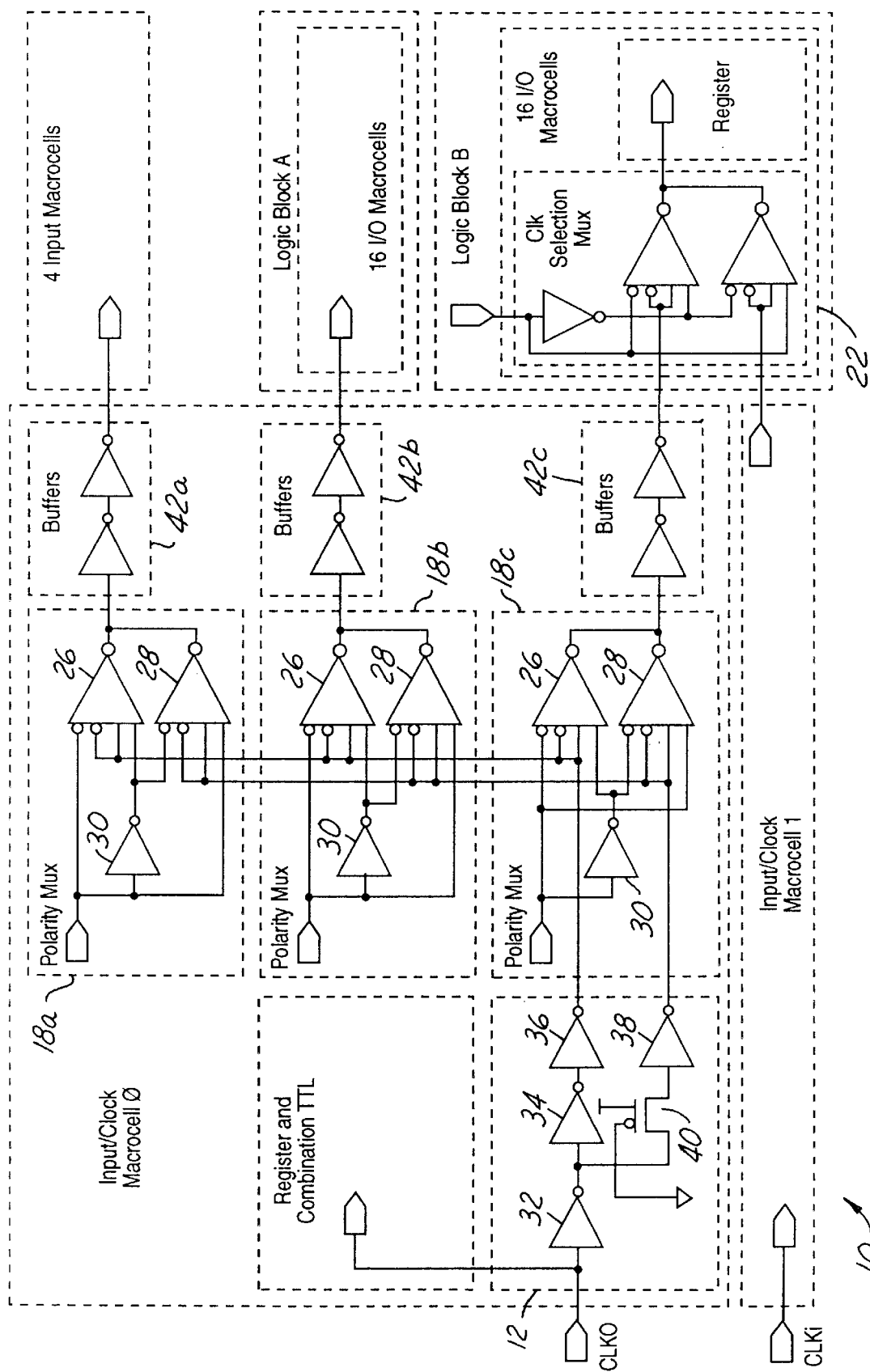
FIG. 2 is a more detailed block diagram of the clocking scheme.

FIG. 5 illustrates an alternative implementation of the clocking scheme 50' that takes advantage of the gain in speed and dynamic current Icc benefits of the present invention, without adding more configuration bits. This allows the clocking scheme 50' to be compatible with older architectures. This may be desirable in some design applications. The clocking scheme 50' accomplishes this result by adding an additional multiplexer 120a to the polarity multiplexer 68a'. The multiplexer 120a receives an input 122a from the input 72a' of the clock configuration multiplexer 66a'. With this configuration, the multiplexer 120a selects between inputs 74a and 74b in a consistent fashion with how the configuration multiplexer 66a' selects between inputs 64a and 64b. Therefore, if the clock input 64a' is selected, the polarity for the clock input 64a' will also be selected. If the clock input 64b is selected, the polarity for the clock input 64b would be selected. While the multiplexer 120a does not provide the full flexibility of the clocking scheme 50 illustrated in FIGS. 3 and 4, it does provide additional flexibility over the previous approach clocking scheme 10. The additional multiplexer 120a is relatively small and has little impact on the die size of the clocking scheme 50.

Figure 6:
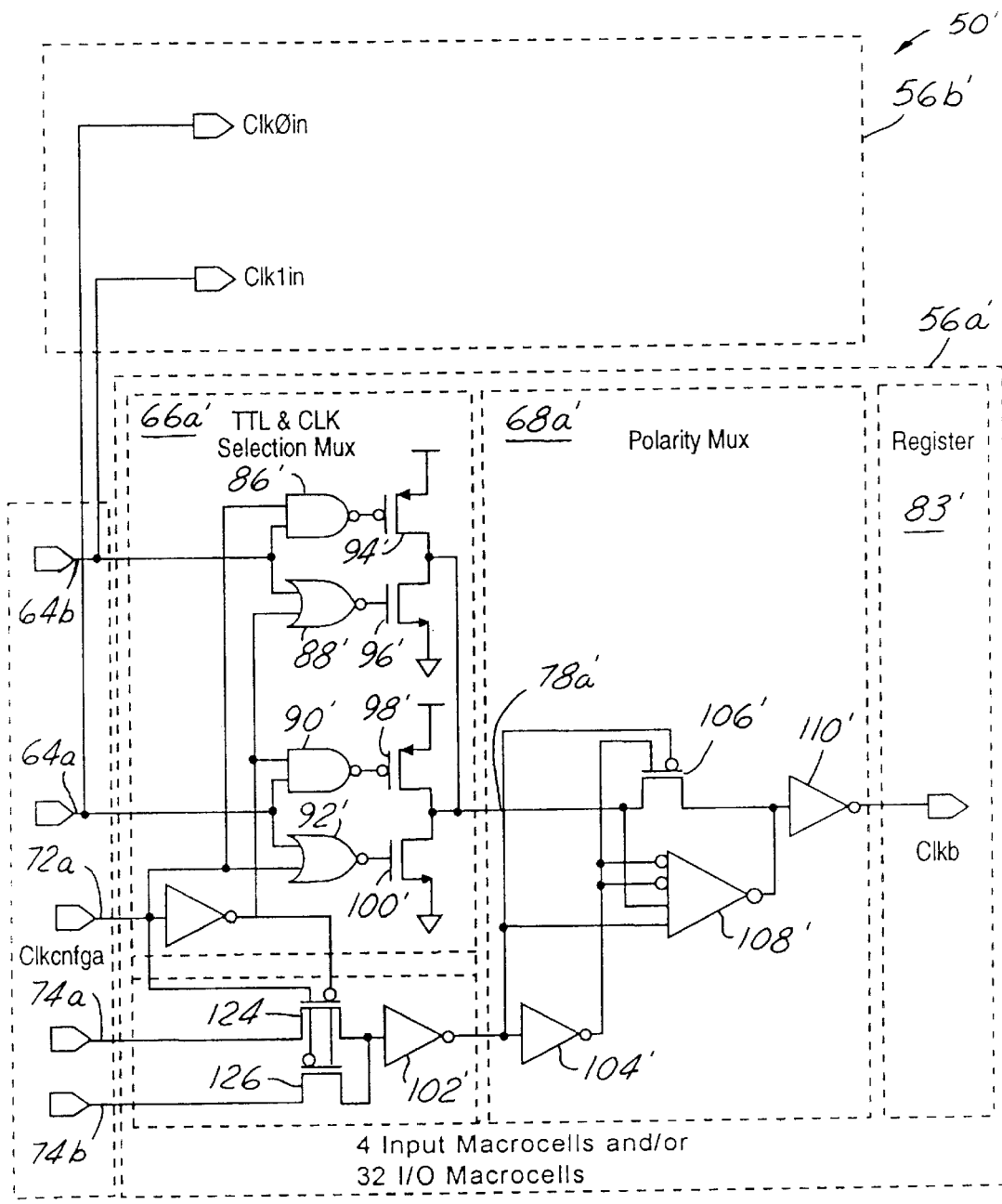
FIG. 6 is a more detailed block diagram of the alternate embodiment of the present invention shown in FIG. 5.

FIG. 6 shows a more detailed diagram of the alternate clocking scheme 50' illustrated in FIG. 5. The polarity multiplexer 68a' has an inverter 102', an inverter 104', a CMOS pass gate 106', an enabled inverter 108' and an inverter 110' that are configured in a similar manner to the polarity multiplexer 68a shown in FIG. 4. The polarity multiplexer 68a' also comprises a CMOS pass gate 124 and a CMOS pass gate 126 that are configured to receive the input 72a from the clock configuration multiplexer 66a.

The clocking scheme 50 described in connection with FIGS. 3 and 4 provides the additional flexibility of independently selecting both an independent clock and a polarity for the selected independent clock for each particular macrocell 70. This additional flexibility is desirable in certain design applications. The clocking scheme 50' illustrated in FIGS. 5 and 6 provides slightly less flexibility, but improved compatibility with existing CPLDs.

Figure 7:
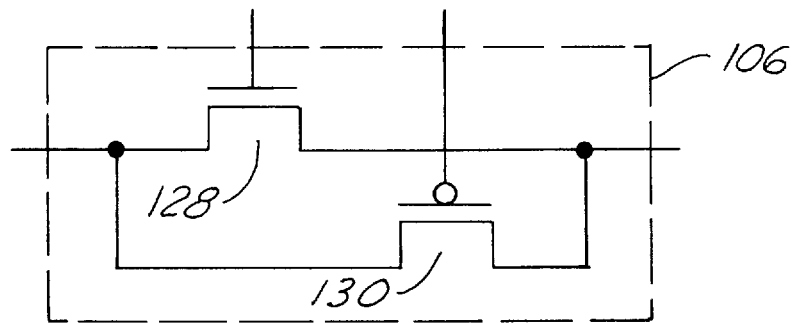
FIG. 7 is a detailed diagram of a CMOS pass gate.
Figure 8:
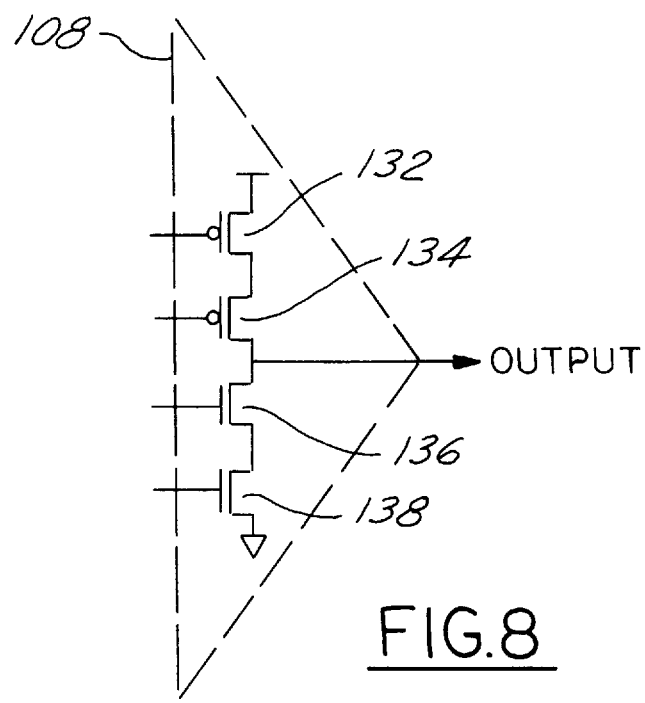
FIG. 8 is a detailed diagram of an enabled inverter.

Referring to FIG. 7, the CMOS pass gate 106 is shown comprising a transistor 128 and a transistor 130. Referring to FIG. 8, the enabled inverter 108 is shown comprising a transistor 132, a transistor 134, a transistor 136 and a transistor 138. The sources and drains in the transistors 132–138 are cascaded together.

While the invention has been particularly shown and described with reference to the preferred embodiments thereof, it will be understood by those skilled in the art that various changes in form and details may be made without departing from the spirit and scope of the invention.

We claim:

1. A circuit for selecting and distributing a clock signal from a plurality of clock signals, comprising:

a clock multiplexer that selects one of said plurality of clock signals to provide a selected clock signal;

a polarity multiplexer that receives said selected clock signal, selects a polarity for said selected clock signal and provides a clock output signal having a selected polarity, said polarity multiplexer comprising a pass gate and an enabled inverter; and one or more devices selected from the group consisting of macrocells and registers, each device receiving said selected clock output.

2. The circuit of claim 1, wherein said enabled inverter and said pass gate are coupled in parallel with each other.

3. The circuit of claim 2, wherein said polarity is selected in response to a configuration bit.

4. The circuit of claim 3, wherein each of said enabled inverter and said pass gate receives said selected clock signal and an inverted signal from said configuration bit.

5. The circuit of claim 2, wherein:

said one of said plurality of clock signals is selected in response to a clock configuration bit; and said polarity is selected in response to a polarity configuration bit.

6. The circuit of claim 1, wherein said polarity and said one of said plurality of clock signals are each selected in response to a single configuration bit.

7. The circuit of claim 1, wherein said one or more devices comprises one or more macrocells.

8. The circuit of claim 7, wherein said circuit for selecting and distributing a clock signal from a plurality of clock signals comprises a macrocell block.

9. The circuit according to claim 1 wherein said clock multiplexer comprises one or more first discrete logic components.

10. The circuit according to claim 9 wherein said clock multiplexer further comprises one or more second discrete logic components having a logic function differing from that of said one or more first discrete logic components.

11. The circuit according to claim 1 comprising a plurality of macrocells.

12. A circuit for distributing clocking signals to macrocell registers comprising:

a plurality of input clocks for providing independent clocking signals;

one or more macrocell blocks each comprising (i) a clock multiplexer for providing a macrocell input from one of said input clocks in response to a clock select input, (ii) a polarity multiplexer comprising a first multiplexer for receiving said clock select input and a second multiplexer for receiving a polarity select input, said polarity multiplexer providing said macrocell input with either a first polarity or a second polarity, wherein said first polarity matches a polarity of one of said input clocks and said second polarity is complementary to said polarity of said one of said input clocks, and (iii) one or more macrocells; and one or more receiving devices, each for receiving at least two of said clocking signals and for providing one of said clocking signals to each of said macrocells.

13. The circuit of claim 12, comprising a plurality of said receiving devices.

14. The circuit of claim 11, comprising at least one macrocell block containing said plurality of macrocells.

15. The circuit of claim 14, comprising a plurality of macrocell blocks, each containing a plurality of said macrocells.

* * * * *